United States Patent [19]

Steininger

[11] Patent Number: 5,108,846

[45] Date of Patent: * Apr. 28, 1992

[54] PROTECTIVE LAYERS OF GERMANIUM CERAMICS

[76] Inventor: Helmut Steininger, 15 Dr.-Ernst-Kilb-Weg, 6520 Worms 26, Fed. Rep. of Germany

[*] Notice: The portion of the term of this patent subsequent to Sep. 18, 2007 has been disclaimed.

[21] Appl. No.: 551,780

[22] Filed: Jul. 12, 1990

[51] Int. Cl.$^5$ ............................................. G11B 5/66
[52] U.S. Cl. .................................. 428/694; 428/697; 428/698; 428/900; 204/192.15; 204/192.16; 204/192.2
[58] Field of Search ................... 428/694, 900, 698; 204/192.15, 192.16, 192.26

[56] References Cited

U.S. PATENT DOCUMENTS

| | | | |
|---|---|---|---|
| 4,661,420 | 4/1987 | Nakamura et al. | 428/694 |
| 4,833,043 | 5/1989 | Gardner | 428/694 |
| 4,957,604 | 9/1990 | Steininger | 284/192.16 |

OTHER PUBLICATIONS

Patent Abstr. of Japan, vol. 13, No. 253 of JP-A-6-2-207911.
Mitsuyu, T. et al, *J. of the Electrochem. Soc.* vol. 123 No. 1 p. 94 (1976).
Umezawa, T, et al, *J. of Vacuum Sci & Tech.* Sect. A, vol. 5, No 4 p. 1783 (Jul./Aug. 1987).
Schmitt, H., et al, *4eme Coloque Internat'l Sur Les Plasmas et la Pulverisation Cathodique*, C.I.P. 82, I U.T. Nice p. 137 (Sep. 13-17 1982).
*IBM Technical Disclosure Bulletin* vol. 28, No. 1 (Jun. 1985).
Singh, A. et al. *J. of Materials Sci.* vol. 24, pp. 307-312 (1989).

*Primary Examiner*—Merrell C. Cashion, Jr.
*Assistant Examiner*—Robert J. Follett
*Attorney, Agent, or Firm*—Keil & Weinkauf

[57] ABSTRACT

The novel polycrystalline, unoriented or X-ray amorphous carbide, oxide and/or nitride ceramics which have the elemental composition I $$Ge_{1-x}M_x \qquad (I)$$

where M is at least one element from the group consisting of titanium, zirconium, hafnium, thorium, scandium, yttrium, lanthanum, cerium, praseodymium, neodymium, samarium, europium, gadolinium, terbium, dysprosium, holmium, erbium, thulium, ytterbium, lutetium, vanadium, niobium, tantalum, chromium, molybdenum, tungsten, manganese, rhenium, iron, cobalt, nickel, ruthenium, rhodium, copper, zinc, magnesium, calcium, strontium, barium, boron, aluminum, gallium, indium, thallium, tin, lead, phosphorus, arsenic, antimony, bismuth and tellurium and x is from 0.01 to 0.7, can be used, in the form of thin layers, as diffusion barriers, anticorrosion layers or interference layers, for protecting surfaces from mechanical abrasion or for protecting magneto-optical recording layers from corrosion. These novel thin polycrystalline, unoriented or X-ray amorphous layers of germanium ceramics can be prepared with the aid of reactive sputtering or reactive magnetron sputtering of a target which consists of the abovementioned elemental composition I.

7 Claims, No Drawings

PROTECTIVE LAYERS OF GERMANIUM CERAMICS

The present invention relates to polycrystalline, unoriented or X-ray amorphous carbide, oxide and/or nitride ceramics which have the elemental composition I $$Ge_{1-x}M_x \quad \text{(I)}$$

where M is at least one element from the group consisting of titanium, zirconium, hafnium, thorium, scandium, yttrium, lanthanum, cerium, praseodymium, neodymium, samarium, europium, gadolinium, terbium, dysprosium, holmium, erbium, thulium, ytterbium, lutetium, vanadium, niobium, tantalum, chromium, molybdenum, tungsten, manganese rhenium, iron, cobalt, nickel, ruthenium, rhodium, copper, zinc, magnesium, calcium, strontium, barium, boron, aluminum, gallium, indium, thallium, tin, lead, phosphorus, arsenic, antimony, bismuth and tellurium and x is from 0.1 to 0.7.

The present invention furthermore relates to thin layers which consist of these germanium ceramics, and their use as diffusion barriers, anticorrosion layers or interference layers, for protecting surfaces from mechanical abrasion or for protecting magneto-optical recording layers from corrosion.

The present invention also relates to a novel magneto-optical recording element which contains at least one thin layer of one of the novel germanium ceramics defined at the outset.

The present invention also relates to a process for the production of thin layers which consist of the germanium ceramics defined at the outset.

Thin polycrystalline or X-ray amorphous layers of carbide, oxide and/or nitride ceramics which have the elemental composition $$(Al_xSi_{1-x})_{1-z}(M_r^1M_s^2M_t^3)_z$$

are described in EP-A-0 326 932.

On the basis of this general formula and observing the conditions according to the patent:

M$^1$, M$^2$ and M$^3$ are each Ti, Zr, Hf, Th, Sc, Y, La, Ce, Pr, Nd, Sm, Eu, Gd, Tb, Dy, Ho, Er, Tm, Yb, Lu, V, Nb, Ta, Cr, Mo, W, Mn, Re, Fe, Co, Rh, Cu, Zn, Mg, Ca, Sr, Ba, B, Ga, In, Tl, Ge, Sn, Pb, P, As, Sb and Te, with the provisos that M$^1$, M$^2$ and M$^3$ are different from one another, or that they are identical to or different from one another when M$^1$, M$^2$ and M$^3$ are each lanthanum or a lanthanide, x is from 0 to 1, z is r+s+t, r and s are each from 0.005 to 0.15 and t is from 0 to 0.005, it is possible to derive germanium-containing ceramics, for example the nitride ceramic $$Al_{0.695}Ge_{0.15}La_{0.155}N$$

which however cannot contain more than 15 atom % of germanium. The polycrystalline or X-ray amorphous ceramic layers described in EP-A-0 326 932 are used in particular for protecting magneto-optical recording layers of amorphous lanthanide/transition metal alloys from corrosion.

U.S. Pat. No. 4,661,420 discloses a thin, X-ray amorphous layer which, in addition to germanium or germanium and silicon, also contains at least one further element from the group consisting of hydrogen, carbon, fluorine, nitrogen and oxygen, in amounts of not more than 50, in particular 30, atom %. This known thin X-ray amorphous layer is used for increasing the Kerr angle of the recording layer of magneto-optical recording elements.

U.S. Pat. No. 4,661,420 gives no information about the anticorrosion effect of the thin X-ray amorphous germanium-containing layer. EP-A-0 326 932 likewise provides no information about the effect of the polycrystalline or X-ray amorphous ceramic layer described therein on the Kerr angle.

Magneto-optical recording elements are likewise known. In general, they contain an optically transparent dimensionally stable substrate (A), a thermally alterable recording layer (B) of an amorphous lanthanide/transition metal alloy and, at least on that side of the recording layer (B) which faces away from the substrate (A), a polycrystalline or X-ray amorphous anticorrosion layer (C). These known magneto-optical recording elements may furthermore have other layers, such as a reflector layer or interference layers.

These known magneto-optical recording elements are used for recording data with the aid of pulse-modulated laser beams, which are focused on the recording layers (B) and/or strike them at right angles.

During recording of data, an auxiliary magnetic field whose field lines are oriented at right angles to the surface of the recording layers (B) is applied to the recording elements, or the recording layers (B) have a correspondingly oriented intrinsic magnetic field.

It is known that the recording layers (B) consisting of amorphous ferrimagnetic lanthanide/transition metal alloys and magnetized at right angles to their surface are heated by the laser beam at the point of contact during recording of the data. As a result of the heating, the coercive force $H_c$ of the alloys decreases. If the coercive force $H_c$ falls below the field strength of the applied (external) magnetic field or of the intrinsic magnetic field at a critical temperature dependent on the particular alloy used, a region which has a magnetization direction opposite to the original direction forms at the point of contact. Such a region is also referred to as a spot.

The recorded data can, if required, also be deleted selectively by local heating of the data-containing recording layer (B), for example by means of a laser beam in an external or intrinsic magnetic field whose field lines are oriented with respect to the layer surface, after which procedure further data may be recorded, i.e. the recording process is reversible.

Data are read using linearly polarized light of a continuous-wave laser whose luminous power is not sufficient to heat the material above the critical temperature. This laser beam is reflected either by the recording layer (B) itself or by a reflector layer arranged behind the said recording layer, an interaction taking place between the magnetic moments in the recording layer (B) and the magnetic vector of the laser light source. As a result of this interaction, the plane of polarization E of the laser light which is reflected by a spot or by a reflector layer behind it is rotated through a small angle with respect to the original plane. If this rotation of the plane of polarization E occurs during reflection of the light at the recording layer (B) itself, this is referred to as the Kerr effect and the angle of rotation accordingly as the Kerr angle; if, on the other hand, the plane is rotated during passage of the light twice through the recording layer (B), the terms Faraday effect and Faraday angle are used.

This rotation of the plane of polarization E of the laser light reflected by the magneto-optical recording element is measured with the aid of suitable optical and electronic apparatuses and is converted into signals.

If the Faraday effect is utilized in the known magneto-optical recording elements during reading of data, it is essential for the recording elements to contain a reflector layer, since the recording layers (B) as such are transparent. Moreover, interference layers must be present in order to suppress troublesome diffraction phenomena. Of course, the reflector layers and interference layers present in the known magneto-optical recording elements, and combinations of the said layers, act as diffusion barriers which to a certain extent prevent corrosion of the extremely oxygen-sensitive and water-sensitive recording layer (B). In practice, however, they do not perform this function to a sufficient extent because their structure and their composition are not determined exclusively by their diffusion barrier action or anticorrosion action but mainly by the other functions. Anticorrosion layers (C), which seal the magneto-optical recording element from the air, must therefore always be present in addition.

Regarding their adhesion to the other layers present in the known magneto-optical recording element, their shelf life, their internal stress or their mechanical strength, the conventional anticorrosion layers (C) still have disadvantages. However, significant progress has been achieved here by the anticorrosion layer (C) described in EP-A 0 326 932, since this anticorrosion layer (C) is scratch-resistant and hard, has good adhesive strength and mechanical strength, is sufficiently stress-free and ensures excellent shielding of the extremely air-sensitive and water-sensitive recording layer (B) of magneto-optical recording elements. It can also be used as an optically transparent interference layer between the substrate (A) and the recording layer (B) and is in this respect clearly superior to other interference layers in its optical adaptability, its anticorrosive action being fully displayed in this application too. Furthermore, it can be readily adapted to the remaining layers of the magneto-optical recording elements in its optical and mechanical properties and in its adhesion properties.

As described above, an increase in the Kerr angle is achieved with the aid of the thin X-ray amorphous germanium- and nitrogen-containing layer of U.S. Pat. No. 4,661,420. However, the patent does not reveal whether this is also applicable to the Faraday angle. In addition, the anticorrosion action of the said layer is very unsatisfactory, particularly when it is intended to shield the magneto-optical recording element from the air.

It is an object of the present invention to provide novel polycrystalline, unoriented or X-ray amorphous carbide, oxide and/or nitride ceramics which, in the form of thin layers, are suitable very generally as diffusion barriers or as interference layers in optical arrangements or for protecting sensitive surfaces from corrosion or mechanical abrasion. In particular, the novel polycrystalline, unoriented or X-ray amorphous ceramics in the form of thin layers should be suitable for protecting magneto-optical recording layers from corrosion without having the disadvantages of the prior art.

We have found that this object is achieved, surprisingly, by polycrystalline, unoriented or X-ray amorphous carbide, oxide and/or nitride germanium ceramics of which, in addition to germanium and carbon, oxygen and/or nitrogen, also contain further elements in exactly defined amounts; in view of the prior art, it was not to be expected that precisely the novel germanium ceramics with their special composition would no longer have the disadvantages described above and moreover would have additional advantages.

The present invention accordingly relates to the polycrystalline, unoriented or X-ray amorphous carbide, oxide and/or nitride ceramics of germanium which are defined at the outset and have the elemental composition I, and which are referred to below as novel ceramic(s) for the sake of brevity.

The novel ceramic is advantageously optically transparent, i.e. for example it neither scatters laser light nor absorbs it to any great extent but allows the relevant laser light to pass through without any essential change in the intensity and the beam cross-section.

The novel ceramic is polycrystalline, unoriented or X-ray amorphous.

The polycrystalline or unoriented novel ceramic is composed of crystallites (microcrystals) whose size is in the nanometer range but which are still capable of diffracting X-ray beams, the crystallites having no preferred orientation in the unoriented novel ceramic.

On the other hand, the X-ray amorphous novel ceramic does not produce any diffraction patterns on exposure to X-ray radiation and in this respect resembles glass, which is known to be amorphous.

In its optical properties and performance characteristics and in its particularly advantageous action, the polycrystalline or unoriented novel ceramic substantially corresponds to the X-ray amorphous novel ceramic, although, depending on the intended use, there may be certain differences, which however can be advantageously utilized.

By its very nature, the novel ceramic corresponds to a ceramic material in the conventional sense, which was formerly understood as comprising inorganic industrial products or engineering materials which are obtained by calcining or firing materials such as clays, etc. and which have high physical and chemical stability. Owing to the very rapid development in the area of the inorganic industrial materials, the meaning of this term has been considerably expanded in recent years and it now also covers materials which are produced not by calcination or firing but by other methods. These materials have a property profile which is superior in many respects to that of traditional ceramics and often includes unusual properties. These materials are therefore frequently designated modern ceramics. The novel ceramic is a new member of these modern ceramics.

In terms of its composition, the novel ceramic may be regarded as a carbide, oxide and/or nitride ceramic, i.e. it consists either of carbides, oxides or nitrides or of a mixture of carbides with nitrides, oxides with carbides, carbides with nitrides or oxides and carbides with nitrides. It has the elemental composition I to be used according to the invention, which composition gives an overview of the molar ratio of the other components with respect to one another, apart from carbon, oxygen and/or nitrogen. This atomic or molar ratio is completely or substantially specified from the outset for a given novel ceramic. On the other hand, the molar ratio of carbon, oxygen and/or nitrogen to the elemental composition I varies, depending on the predetermined elemental composition I, in the manner inevitably prescribed by the valence of the atoms and/or by the number of positive or negative electric charges present. Thus, the carbon, oxygen and/or nitrogen content of a novel ceramic can be readily calculated via the particular elemental composition I used, so that an exact statement of the particular carbon, oxygen and/or nitrogen content is unnecessary below, and simply stating that it is, for example, a novel oxide ceramic or nitride ceramic or a novel oxide and nitride ceramic having a certain oxygen/nitrogen ratio is sufficient for complete characterization of the composition of the relevant novel ceramic.

The elemental composition I to be used according to the invention contains the component germanium as well as the component M. This is at least one further element selected from the group consisting of titanium, zirconium, hafnium, thorium, scandium, yttrium, lanthanum, cerium, praseodymium, neodymium, samarium, europium, gadolinium, terbium, dysprosium, holmium, erbium, thulium, ytterbium, lutetium, vanadium, niobium, tantalum, chromium, molybdenum, tungsten, manganese, rhenium, iron, cobalt, nickel, ruthenium, rhodium, copper, zinc, magnesium, calcium, strontium, barium, boron, aluminum, gallium, indium, thallium, tin, lead, phosphorus, arsenic, antimony, bismuth and tellurium.

The elemental composition I to be used according to the invention may contain only one of these elements M. However, it is advantageous if the said elemental composition I contains two or three of these elements M, since the performance characteristics of the novel ceramics which result from the relevant elemental compositions I can then particularly simply and advantageously be adapted to specific intended uses. In less frequent cases, it may be advisable to introduce more than three, for example four, five, six or seven, elements M into the elemental composition I to be used according to the invention, although this results in only a comparatively small further improvement of the performance characteristics of the novel ceramics, which characteristics are in any case already excellent.

Elemental compositions I which are particularly preferably used according to the invention contain scandium, yttrium, lanthanum, aluminum and/or silicon, because the novel ceramics based on these elemental compositions I are very particularly suitable for the production of anticorrosion layers (c) for magneto-optical recording elements.

In the elemental compositions I to be used according to the invention, germanium and the components M have a certain molar ratio with respect to one another, which is expressed by the index x of the general formula I stated at the outset. Here, x may be any positive number from 0.01 to 0.7. Although it is impossible for x to assume values greater than 0.7, for example from 0.75 to 0.85, the germanium-containing ceramics which result from the relevant elemental compositions no longer fully meet the practical requirements. According to the invention, it is advantageous if x is any positive number from 0.05 to 0.5, in particular from 0.1 to 0.4, because the said elemental compositions I having these molar ratios give novel ceramics which have a particularly wide range of uses and display their special advantages in a very wide variety of application forms.

Examples of elemental compositions I which are very particularly preferably used according to the invention are listed below:

List:

I-1 $Ge_{0.7}Al_{0.2}Sc_{0.1}$
I-2 $Ge_{0.8}Al_{0.15}Y_{0.05}$
I-3 $Ge_{0.8}Al_{0.08}Si_{0.02}$
I-4 $Ge_{0.95}Al_{0.04}La_{0.01}$
I-5 $Ge_{0.75}Si_{0.2}Y_{0.094}La_{0.01}$
I-6 $Ge_{0.85}Al_{0.1}Sc_{0.03}Y_{0.02}$
I-7 $Ge_{0.9}Al_{0.05}Sc_{0.02}La_{0.03}$
I-8 $Ge_{0.8}Al_{0.15}Y_{0.02}La_{0.03}$
I-9 $Ge_{0.85}Al_{0.08}Si_{0.04}La_{0.03}$
I-10 $Ge_{0.75}Si_{0.2}Sc_{0.03}La_{0.02}$
I-11 $Ge_{0.785}Si_{0.2}Y_{0.05}$

The novel ceramic can be used in a very wide range of external forms, for example as solid spheres, rings, cylinders, blocks or other moldings whose shape and composition depend on the particular intended use. However, the novel ceramic has very particular advantages in the form of a thin layer, the embodiment which is very particularly preferred according to the invention.

The novel thin layers of the ceramics according to the invention may have different compositions. If such a novel thin layer consists of, for example, oxides and nitrides, the oxygen and nitrogen may be randomly distributed in the relevant novel thin layer, i.e. the layer is homogeneous and may be polycrystalline, unoriented or X-ray amorphous. In addition, the said layer may be an oxide/nitride ceramic which contains both microcrystals of oxides and microcrystals of nitrides randomly distributed, i.e. the relevant novel thin layer is a polycrystalline layer. This also applies in the general sense to novel thin layers which consist of oxides and carbides of carbides and nitrides or of oxides, carbides and nitrides.

The polycrystalline, unoriented or X-ray amorphous novel thin layers can, however, also have a gradient, for example with respect to the distribution of the oxygen and nitrogen over the layer thickness. This means that the concentration of nitrogen may increase uniformly starting from one side of the novel thin layer to the other side, and the concentration of the oxygen then decreases in a corresponding manner determined by the stoichiometry. However, this may also mean that the concentration of the nitrogen can initially increase starting from one side of the novel thin layer and then again gradually, i.e. in a fluid manner, or abruptly, decrease, here too the concentration of the oxygen decreasing in a corresponding manner and then increasing again. This may occur several times over the total thickness of the novel thin layer, resulting in a multistratum structure of the relevant layer. This also applies in the general sense to the novel thin layers which consist of oxide and carbides, of carbides and nitrides or of oxides, carbides and nitrides.

These multistratum novel thin layers may accordingly consist of two or more separate strata, and each separate stratum may be a carbide, nitride or oxide stratum or a carbide/oxide, carbide/nitride, oxide/nitride or carbide/oxide/nitride stratum.

In most cases, from three to five separate strata are sufficient for obtaining an optimum property profile, but in particular cases novel thin layers of six, seven or eight strata may be used. The novel thin layers of nine, ten or more strata are more rarely used because the higher production cost is not always justified by a further increase in the properties, which are in any case particularly advantageous. Hence, novel thin layers of three to five strata are especially advantageous because they can be prepared at comparatively low cost and already have optimum properties.

The strata in these novel thin layers may have different thicknesses. However, it is advantageous if they have roughly the same thicknesses.

Furthermore, the transition from one stratum to the other may be abrupt, i.e. there is an exactly defined interface between the strata, for example in the transition from a stoichiometric nitride stratum to an oxide or carbide stratum. However, the transition may also be fluid. For example, the transition zone between z stoichiometric nitride stratum and a pure oxide or a pure carbide stratum may be a zone in which the concentration of the nitrogen decreases more or less rapidly and the concentration of the oxygen or of the carbon increases more or less rapidly.

According to the invention, a fluid transition from one stratum to the next is advantageous.

Regardless of whether a polycrystalline, unoriented or X-ray amorphous, single-stratum or multistratum novel thin layer of nitrides, carbides and/or oxides of the elemental composition I to be used according to the invention is employed, according to the invention it is particularly advantageous if that side of the relevant novel thin layer which faces a surface, for example the surface of a magneto-optical recording layer (B) to be protected, or is directly adjacent to the said surface, consists mainly or exclusively of nitrides.

Regardless of whether a polycrystalline, unoriented or X-ray amorphous, single-stratum or multistratum thin layer of nitrides and oxides, carbides and oxides, nitrides and carbides or carbides, oxides and nitrides or a polycrystalline or X-ray amorphous novel thin layer of carbides, oxides or nitrides is used, the said layer is not more than 1000 nm thick. Because of its particular properties and technical effects due to the novel ceramics, greater layer thicknesses are unnecessary. Furthermore, the greater consumption of material required for this purpose results in only a comparatively small further improvement in the property profile, which is in any case advantageous. The thickness of the novel thin layers should on the other hand not be less than 20 mm, since in this case, for example, the barrier effect of the said layers with respect to oxygen and water is no longer completely satisfactory. Thicknesses of from 30 to 800 nm are advantageous, the thickness range from 30 to 500 nm being particularly noteworthy and that from 40 to 250 nm being very particularly noteworthy. Within the thickness range from 40 to 250 nm, the range from 40 to 100 to nm is in turn of particular importance because novel thin layers having this thickness have an optimum property profile with respect to the barrier effect, material consumption, production cost, mechanical strength, toughness and stability and are therefore particularly useful. Accordingly, the range from 40 to 100 nm is an optimum within which the thickness of the novel thin layer can be varied and adapted in an advantageous and excellent manner to the composition and technical parameters of, for example, magneto-optical recording elements.

Regardless of whether 20-1000 nm thick polycrystalline, unoriented or X-ray amorphous, single-stratum or multistratum novel thin layers of nitrides and oxides, carbides and oxides, nitrides and carbides or carbides, oxides and nitrides or 20-1000 nm thick, polycrystalline, unoriented or X-ray amorphous novel thin layers of carbides, oxides or nitrides are used, the novel carbide, oxide and/or nitride ceramic of these novel thin layers always have the elemental composition I to be used according to the invention.

This means that the novel ceramics of which the novel thin layers consist have a uniform or a substantially uniform composition with regard to the elemental composition I over their entire volume, i.e. the said layers are free or substantially free of concentration gradients with regard to their elemental composition I.

In terms of the method, the preparation of the novel ceramic according to the invention has no special features but is carried out by the conventional and known techniques for the preparation of modern ceramics. The preparation of the novel ceramic in its particularly advantageous embodiment of the thin layer is preferred according to the invention. The production of the novel thin layers also has no special features with regard to the method and is carried out by the conventional and known techniques for the production of thin carbide, oxide and/or nitride ceramic layers by vapor deposition, reactive vapor deposition, ion plating, ion cluster beam deposition (ICB), sputtering or reactive sputtering. Among these techniques, reactive sputtering is advantageously used and reactive magnetron sputtering is very particularly advantageously used.

In reactive sputtering, it is known that the material of a target is converted into the gas phase (sputtered) by bombardment with helium, neon, argon, krypton and/or xenon ions under reduced pressure. Further components, for example hydrocarbons, oxygen and/or nitrogen, are mixed with the gas produced in this manner, the said further components, together with the sputtered target material, forming the process gas. From this process gas, the sputtered target material is deposited, together with the reactive components, as a thin ceramic layer on the surface to be coated. In reactive magnetron sputtering, it is known that the target is in a magnetic field.

By varying the process parameters, such as sputtering rate, deposition rate, process gas pressure and composition, it is possible to produce polycrystalline, unoriented by or X-ray amorphous thin novel layers from novel ceramics of the desired composition in a very controlled and very exact manner. Suitable process parameters can be selected on the basis of the existing technical knowledge in the area of reactive (magnetron) sputtering and/or with reference to preliminary experiments.

According to the invention, the novel thin layers are produced using targets which have the elemental composition I to be used according to the invention. The targets are in the form of flat disks or sheets and are produced by thorough mixing, homogenization and shaping of germanium and the components M described above, with the aid of the conventional and known mixing and shaping techniques.

Examples of very particularly suitable target compositions I are the elemental compositions I-1 to I-11 from the abovementioned list.

According to the invention, it is particularly advantageous to sputter this target composition having elemental composition I under reduced pressure in an atmosphere in which the volume ratio of noble gas to the reactive gases is from 1 : 5 to 100 : 1, the noble gas used comprising one or more noble gases from the group consisting of neon, argon, krypton and xenon, or advantageously a mixture of argon and one or more noble gases from the group consisting of neon, krypton and xenon, the volume ratio of argon to the other noble gas or gases being from 1 : 5 to 10 : 1. It is also advantageous if the process gas contains hydrogen, since in many cases the presence of the hydrogen further improves the success of the process. If hydrogen is present, the volume ratio of the reactive gases to hydrogen is from 2 : 1 to 20 : 1.

The novel ceramics, in particular in the shape of the thin novel layers, are very useful as diffusion barriers, anticorrosion layers or interference layers or for protecting sensitive surfaces from mechanical abrasion. They are used in particular for protecting the outermost air-sensitive and water-sensitive recording layers (B) of novel magneto-optical recording elements from corrosion. When performing this function, the novel thin layers are referred to as novel anticorrosion layers (C). They are that component of the novel magneto-optical recording elements which is essential according to the invention. They are produced by the methods described above in connection with the production of the novel magneto-optical recording elements, the order of the individual process steps inevitably arising from the desired structure of the particular novel magneto-optical recording element to be produced.

The further essential component of the novel magneto-optical recording element is the optically transparent dimensionally stable substrate (A). Advantageous substrates (A) are the conventional and known, disk-shaped, optically transparent dimensionally stable substrates (A) having a diameter of 90 or 130 mm and a thickness of 1.2 mm. They generally consist of glass or of plastics, for example polycarbonate, polymethyl methacrylate, polymethylpentene, cellulose acetobutyrate or a mixture of poly(vinylidene) fluoride and polymethyl methacrylate or polystyrene and poly-(2,6-dimethylphen-1,4-ylene ether). Among these, the substrates (A) of plastics are particularly advantageous.

That surface of the dimensionally stable substrate (A) which faces the recording layer (B) may have structures. The structures in the surface of the substrate (A) are in the micrometer and/or submicrometer range. They are used for exact guidance of the read laser beam and ensure a rapid and exact response of the tracking and autofocusing means in the laser-optical write and read heads of the disk drives, i.e. they permit tracking. These structures may furthermore themselves be data, as is the case, for example, in the known audio or video compact disks, or they may serve for coding the recorded data. The structures consist of raised parts and/or of indentations. These are in the form of continuous concentric or spiral tracks or in the form of isolated hills and/or holes. Furthermore, the structure may have a more or less smooth waveform. Tracks are preferred here. They have, in their transverse direction, a rectangular sawtooth-like, a V-shaped or a trapezoidal contour. Their indentations are generally referred to as grooves and their raised parts as land. Of particular advantage are tracks having 50–200 nm deep and 0.4–0.8 $\mu$m wide grooves separated by a 1–3 $\mu$m wide land.

The particularly preferably used dimensionally stable substrate (A) is produced in a conventional manner by shaping the plastic or plastic blend forming the substrate (A), by injection molding under clean-room conditions, as described in detail in, for example, German Patent Application P 37 27 093.1.

Dimensionally stable substrates (A) having tracks on one of their surfaces are very particularly preferably produced in this manner.

The other essential component of the novel magneto-optical recording element is the magneto-optical recording/layer (B) of an amorphous lanthanide/transition metal alloy. The recording layer (B) is from 10 to 500 nm thick. The lanthanides Pr, Nd, Sm, Eu, Gd, Tb, Dy and Ho and the transition metals Fe and Co are suitable for producing the recording layer (B). Suitable mixing ratios of lanthanides to transition metals are known from the prior art. Furthermore, the amorphous lanthanide/transition metal alloy may also contain other elements, such as Sc, Y, La, V, Nb, Ta, Cr, No, W, Mn, Ni, Re, Ru, Os, Rh, Ir, Pd, Pt, Cu, Ag, Au, Zn, B, Al, Ga, In, Si, Ge, Sn, Pb, P, As, Sb and/or Bi in conventional and known amounts.

In the production of the novel magneto-optical recording element, the recording layer (B) is produced on the dimensionally stable substrate (A), advantageously on a layer present on the substrate (A), by the above-mentioned techniques for producing the novel thin layers.

In addition, the novel magneto-optical recording element may contain further layers which are useful for the functioning of the recording element. These are the conventional and known interference layers, reflector layers or adhesion-promoting layers or further magnetizable layers. Furthermore, two of the novel magneto-optical recording elements may be connected to one another in the form of a sandwich, so that their recording layers (B) face one another and there is a certain distance between them, the conventional and known techniques for connecting two recording elements being used.

Usually, a defined magnetization oriented at right angles to the layer surface is induced in the recording layers (B) after the production of the novel magneto-optical recording elements.

The particularly preferred novel magneto-optical recording element is the novel magneto-optical disk comprising 1. the particularly preferably used dimensionally stable substrate (A) described above,
2. the first novel anticorrosion layer (C),
3. the recording layer (B) described above and
4. the second novel anticorrosion layer (C), and, if required, additional conventional and known layers.

The individual layers of this novel magneto-optical disk are produced by the methods described above, the order of the process steps inevitably arising from the composition (A), (C), (B), (C).

Data in the form of magnetically reversed sports can be recorded on the novel magneto-optical recording elements in a conventional manner from the side of the optically transparent dimensionally stable substrate (A) with the aid of a pulse-modulated write laser beam which has a wavelength $\lambda$ of less than 1000 nm and is focused on the recording layers (B) and/or strikes the said layers at right angles. The data can then be read with the aid of a continuous-wave laser beam which is focused on the data-containing recording layers (B) and/or strikes the said layers at right angles, the light reflected by the recording layers (B) themselves or by any reflector layers present being collected, analyzed and converted into signals. In the case of the novel magneto-optical disks, the conventional and known laser-optical disk drives having laser-optical heads which contain semi-conductor lasers can be used for this purpose.

Compared with the prior art, the novel magneto-optical recording elements have particular advantages which are finally based on the use of the novel ceramic for producing the novel anticorrosion layer (C). They have higher sensitivity than known magneto-optical recording elements and can therefore be recorded on using correspondingly lower laser power. At the same laser power, the novel magneto-optical disks can therefore be recorded on at higher disk speeds than known disks. Furthermore, their bit density is substantially higher compared with the prior art. On reading, they give undistorted signals and have a signal-to-noise ratio of more than 55 dB. Even after a storage time of more than 1000 hours at 70° C. and at a relative humidity of 90%, there is no increase in the bit error rate, i.e. there is no loss of information.

As described above, the novel magneto-optical recording elements have at least one novel anticorrosion layer (C) which consists of the novel ceramic. This novel anticorrosion layer (C) is scratch-resistant and hard, has good adhesive strength and mechanical strength, is stress-free and shields the extremely air-sensitive and water-sensitive recording layer (B) in an excellent manner. If the novel anticorrosion layer (C) is also used as an optically transparent interference layer between the substrate (A) and the recording layer (B), it is clearly superior to conventional interference layers in its optical adaptability. Furthermore, the excellent anticorrosive action of the novel anticorrosion layer (C) is also fully displayed here. Very particular advantages are obtained if both sides of the recording layer (B) are covered with the novel anticorrosion layer (C). In particular, this extends the life of the novel recording materials beyond the period achieved to date. Moreover, the fact that the novel anticorrosion layer (C) can be adapted, in terms of its optical and mechanical properties and its adhesion properties, in an excellent but simple manner to the other layers of the novel magneto-optical recording elements is an advantage. In addition, the novel anticorrosion layer (C), when functioning as an interference layer, is capable of increasing the Kerr angle and the Faraday angle, making the novel magneto-optical recording elements even more attractive in practice.

EXAMPLES

In the Examples and Comparative Experiments below, the preparation and the particular technical advantages of the novel ceramics are described in detail in connection with the production and use of the novel magneto-optical recording elements.

EXAMPLES 1 TO 22

Production and performance characteristics of novel magneto-optical disks

Forty-four polycarbonate disks having a diameter of 130 mm and a thickness of 1.2 mm and provided with tracks were produced, as dimensionally stable substrates (A), by injection molding under clean-room conditions.

Thereafter, the individual layers (B) and (C) were applied in the desired number, sequence and thickness and with the particular desired internal composition, from the gas phase, onto that side of the said disks which were provided with tracks, while rotating the polycarbonate disks (A) (22 disks, Examples 1 to 22). The novel anticorrosion layers (C) were applied by reactive magnetron sputtering of the relevant elemental compositions I-1 to I-11 under reduced pressure and by admixing the desired amounts of hydrocarbons, oxygen and/or nitrogen with the particular process gas. On the other hand, the recording layers (B) were produced by sputtering a target consisting of Tb, Dy and Fe. Here, the process parameters were chosen so that the compositions, stated in Table 1, of the novel magneto-optical disks resulted (Examples 1 to 22).

To check the success of the process and for analytical purposes, a further 22 novel magneto-optical disks were produced, in each case under exactly comparable conditions (Examples 1a to 22a). These disks were used for investigating the morphology and composition of the novel anticorrosion layers (C), which consisted of the novel ceramics, by means of conventional and known, in some cases destructive, analytical methods, such as chemical elemental analysis, optical microscopy, scanning electron microscopy, X-ray spectroscopy, X-ray scattering, ESCA (electron spectroscopy for chemical analysis) and flamephotometry. Furthermore, the conventional and known, nondestructive optical and spectroscopic methods were used to ascertain that the particular novel anticorrosion layers (C) of the pairs of Examples (1, 1a) to (22, 22a) were identical to one another in each case, so that the composition-related and morphological parameters determined from Examples 1a to 22a could be included in Table 1.

The recording layers (B) of the novel magneto-optical disks of Examples 1 to 22 were magnetized at right angles to their surface directly after their production. The said disks were then conditioned for 48 hours at $23\pm2°$ C. and under an atmospheric pressure of $103\pm3.5$ kPa and at a relative humidity of from 45 to 55%.

Data were then recorded on the conditioned disks with the aid of a conventional and known disk drive under exactly comparable conditions. A pulse-modulated GaAlAs semiconductor laser which emitted linearly polarized light of wavelength $\lambda=830$ nm was used for this purpose. Both the bit length, i.e. the diameter of the magnetically reversed spots, and the bit spacing, i.e. the distance from spot to spot, were about 1 $\mu$m.

To read the recorded data via the Kerr effect (Examples 1 to 11) or via the Faraday effect (Examples 12 to 22), the GaAlAs semiconductor laser was used in the continuous-wave mode with a light power of 2 mW. The uncorrected bit error rate was determined in a conventional and known manner by means of a time interval analyzer (TIA).

The novel magneto-optical disks were first read immediately after recording (1st reading step). Thereafter, the disks were then subjected to the accelerated lift test typical for magneto-optical recording elements, at 60°, 70° and 80° C. and at a relative humidity of 90%, and were then read again (2nd reading step). The life of the said disks under normal conditions (30° C., 90% relative humidity) was estimated from the resulting uncorrected bit error rates and from the optical and scanning electron microscopic evaluation of the recording layers (B) of the novel magneto-optical recording disks. The relevant results are shown in Table 2.

COMPARATIVE EXPERIMENT V1

Production and performance characteristics of a magneto-optical recording element disclosed in U.S. Pat. No. 4,661,420

A comparison disk having the structure and composition below was produced by the method stated in U.S. Pat. No. 4,661,420, column 6, lines 18 to 27:
Substrate (A): 1.2 mm thick glass sheet having a diameter of 130 mm;
First layer: $(GeSi)_{0.9}N_{0.1}$; X-ray amorphous, 1 stratum, 120 nm;
Recording layer (B): TbFe, 100 nm;
Known anticorrosion layer: $SiO_2$, 100 nm.

The comparison disk was magnetized, recorded with data, read and tested, these steps being carried out as stated in Examples 1 to 22. The test results obtained are compared in Table 2 with the values from Examples 1 to 22.

The comparison shows that this magneto-optical recording element of known composition was inferior to the novel magneto-optical recording elements with regard to the shelf life, which was evident from its substantially increased bit error rate in the second reading step.

TABLE 1

Structure and composition of the novel magneto-optical disks

| Example No. | First novel anticorrosion layer (C) Elemental composition I and morphology | Atomic ratio O:N:C and thickness (nm) | Recording layer (B) (nm) | Second novel anticorrosion layer (C) Elemental composition I and morphology | Atomic ratio O:N:C and thickness (nm) | Reflector layer (nm) | Third novel anticorrosion layer (C) Elemental composition I and morphology | Atomic ratio O:N:C and thickness (nm) |
|---|---|---|---|---|---|---|---|---|
| 1 | I-1 X-ray amorphous 2-stratum | 1:2:0 (75) | TbDyFe (80) | I-1 X-ray amorphous 1-stratum | 1:2.5:0 (50) | — | — | — |
| 2 | I-2 Polycrystalline 3-stratum | 1:3:0.1 (80) | TbDyFe (90) | I-2 Polycrystalline 4-stratum | 1:1:0 (70) | — | — | — |
| 3 | I-3 Unoriented 1-stratum | 1:20:0 (75) | TbDyFe (85) | I-3 X-ray amorphous 1-stratum | 1:1:100 (45) | — | — | — |
| 4 | I-4 X-ray amorphous 1-stratum | 15:1:0 (70) | TbDyFe (80) | I-4 X-ray amorphous 2-stratum | 1:3:0 (80) | — | — | — |
| 5 | I-5 Polycrystalline 4-stratum | 1:1:0 (75) | TbDyFe (80) | I-5 X-ray amorphous 1-stratum | 1:200:0 (70) | — | — | — |
| 6 | I-6 Polycrystalline 1-stratum | 100:1:0 (70) | TbDyFe (80) | I-6 X-ray amorphous 1-stratum | 150:1:0.1 (60) | — | — | — |
| 7 | I-7 Polycrystalline 4-stratum | 1:1:0.5 (80) | TbDyFe (80) | I-7 X-ray amorphous 1-stratum | 150:1:0.1 (60) | — | — | — |
| 8 | I-8 X-ray amorphous 1-stratum | 100:1:0 (70) | TbDyFe (90) | I-8 X-ray amorphous 2-stratum | 1:1:0 (70) | — | — | — |
| 9 | I-9 Unoriented 1-stratum | Only O (75) | TbDyFe (80) | I-9 Polycrystalline 1-stratum | Only N (40) | — | — | — |
| 10 | I-10 Polycrystalline 1-stratum | 1:10:0 (70) | TbDyFe (75) | I-10 X-ray amorphous 1-stratum | Only N (50) | — | — | — |
| 11 | I-11 Polycrystalline 4-stratum | 200:1:0.1 (80) | TbDyFe (90) | I-11 X-ray amorphous 1-stratum | Only N (60) | — | — | — |
| 12 | I-1 X-ray amorphous 1-stratum | 100:1:0.2 (80) | TbDyFe (20) | I-1 X-ray amorphous 1-stratum | Only O (100) | Al (500) | I-1 X-ray amorphous 1-stratum | Only N (40) |
| 13 | I-2 Polycrystalline 1-stratum | 100:1:0 (80) | TbDyFe (25) | I-2 X-ray amorphous 1-stratum | 100:1:0 (150) | Al (300) | I-2 X-ray amorphous 1-stratum | Only N (50) |
| 14 | I-3 Polycrystalline 5-stratum | 1:1:0 (70) | TbDyFe (23) | I-3 X-ray amorphous 1-stratum | Only O (100) | Al (350) | I-3 X-ray amorphous 4-stratum | 1:2:0 (40) |
| 15 | I-4 Polycrystalline 1-stratum | Only O (80) | TbDyFe (30) | I-4 X-ray amorphous 1-stratum | Only O (150) | Al (500) | I-4 Unoriented 5-stratum | 1:1:0 (60) |
| 16 | I-5 Polycrystalline 1-stratum | Only O (70) | TbDyFe (22) | I-5 Polycrystalline 1-stratum | Only O (80) | Al (400) | I-5 Polycrystalline 1-stratum | 200:1:100 (80) |
| 17 | I-6 X-ray amorphous 1-stratum | 1000:1:0 (75) | TbDyFe (20) | I-6 X-ray amorphous 1-stratum | Only O (80) | Al (300) | I-6 Polycrystalline 3-stratum | 1:2:300 (40) |
| 18 | I-7 X-ray amorphous 1-stratum | 1:1:0 (70) | TbDyFe (20) | I-7 X-ray amorphous 1-stratum | 1:1 (95) | Al (300) | I-7 X-ray amorphous 2-stratum | 1:1:0 (40) |
| 19 | I-8 Unoriented 1-stratum | 100:1:0 (80) | TbDyFe (25) | I-8 Polycrystalline 2-stratum | 3:1:0 (100) | Al (450) | I-8 Polycrystalline 1-stratum | Only C (60) |
| 20 | I-9 | 50:1:0.1 | TbDyFe | I-9 | 100:1:0 | Al | I-9 | 1:100:0 |

TABLE 1-continued

Structure and composition of the novel magneto-optical disks

| Example No. | First novel anticorrosion layer (C) Elemental composition I and morphology | Atomic ratio O:N:C and thickness (nm) | Recording layer (B) (nm) | Second novel anticorrosion layer (C) Elemental composition I and morphology | Atomic ratio O:N:C and thickness (nm) | Reflector layer (nm) | Third novel anticorrosion layer (C) Elemental composition I and morphology | Atomic ratio O:N:C and thickness (nm) |
|---|---|---|---|---|---|---|---|---|
| 21 | Polycrystalline 2-stratum I-10 X-ray amorphous 1-stratum | (70) Only O (100) | (25) TbDyFe | Unoriented 1-stratum I-10 Polycrystalline 1-stratum | (100) Only O (90) | (300) Al | Polycrystalline 1-stratum I-10 X-ray amorphous 1-stratum | (50) Only N (55) |
| 22 | I-11 X-ray amorphous 2-stratum | 1:2:0 (70) | (20) TbDyFe (27) | I-11 X-ray amorphous 1-stratum | 1:1000 (100) | (300) Al (350) | I-11 X-ray amorphous 1-stratum | 1:1:1000 (40) |

TABLE 2

| Example | Test results Bit error rate (uncorrected) 1st reading step | 2nd reading step | Life (years) |
|---|---|---|---|
| 1 | <10⁻⁵ | <10⁻⁵ | >15 |
| 2 | <10⁻⁵ | <10⁻⁵ | >15 |
| 3 | <10⁻⁵ | <10⁻⁵ | >15 |
| 4 | <10⁻⁵ | 10⁻⁵ | ~15 |
| 5 | <10⁻⁵ | <10⁻⁵ | >15 |
| 6 | 10⁻⁵ | 10⁻⁵ | ~15 |
| 7 | <10⁻⁵ | 10⁻⁵ | ~15 |
| 8 | 10⁻⁵ | 10⁻⁵ | ~15 |
| 9 | <10⁻⁵ | <10⁻⁵ | >15 |
| 10 | <10⁻⁵ | <10⁻⁵ | >15 |
| 11 | <10⁻⁵ | 10⁻⁵ | >15 |
| 12 | <10⁻⁵ | <10⁻⁵ | >15 |
| 13 | 10⁻⁵ | 10⁻⁵ | ~15 |
| 14 | <10⁻⁵ | <10⁻⁵ | >15 |
| 15 | <10⁻⁵ | 10⁻⁵ | >15 |
| 16 | 10⁻⁵ | 10⁻⁵ | >15 |
| 17 | 10⁻⁵ | 10⁻⁵ | >15 |
| 18 | <10⁻⁵ | <10⁻⁵ | >15 |
| 19 | 10⁻⁵ | 10⁻⁵ | >15 |
| 20 | <10⁻⁵ | 10⁻⁵ | ~15 |
| 21 | <10⁻⁵ | <10⁻⁵ | >15 |
| 22 | <10⁻⁵ | 10⁻⁵ | ~15 |
| Comp. Exp. VI | 10⁻⁵ | 2.10⁻⁴ | 10-11 |

I claim:

1. A thin layer on a substrate, said thin layer comprising a polycrystalline, unoriented or X-ray amorphous carbide, oxide, nitride, carbide/oxide, carbide/nitride, oxide/nitride or carbide/oxide/nitride ceramic which has the elemental composition I $$Ge_{1-x}M_x \qquad (I)$$

where M is at least one element from the group consisting of titanium, zirconium, hafnium, thorium, scandium, yttrium, lanthanum, cerium, praseodymium, neodymium, samarium, europium, gadolinium, terbium, dysprosium, holmium, erbium, thulium, ytterbium, lutetium, vanadium, niobium, tantalum, chromium, molybdenum, tengsten, manganese, rhenium, iron, cobalt, nickel, ruthenium, rhodium, copper, zinc, magnesium, calcium, strontium, barium, boron, aluminum, gallium, indium, thallium, silicon, tin, lead, phosphorus, arsenic, antimony, bismuth and tellurium and x is from 0.01 to 0.7, wherein the carbon, oxygen and/or nitrogen content is obeying stoichiometry with respect to composition I.

2. A magneto-optical recording element having
A) an optically transparent dimensionally stable substrate,
B) a thermally alterable recording layer of an amorphous lanthanide/transition metal alloy and, at least on that side of the recording layer which faces away from the substrate (A),
(C) a thin polycrystalline, unoriented or X-ray amorphous layer of carbide, oxide, nitride, carbide/oxide, carbide/nitride, oxide/nitride or carbide/oxide/nitride ceramic, wherein the thin polycrystalline, unoriented or X-ray amorphous layer (C) consists of the carbide, oxide, nitride, carbide/oxide, carbide/nitride, oxide/nitride or carbide/oxide/nitride ceramic as defined in claim 1.

3. A process for the production of a thin polycrystalline, unoriented or X-ray amorphous carbide, oxide, nitride, carbide/oxide, carbide/nitride, oxide/nitride or carbide/oxide/nitride ceramic layer on a surface comprising the following steps in the stated order:
(1) production of a sputter gas by vaporization of a target having the elemental composition I $$Ge_{1-x}M_x \qquad (I)$$

where M is at least one element from the group consisting of titanium, zirconium, hafnium, thorium, scandium, yttrium, lanthanum, cerium, praseodymium, neodymium, samarium, europium, gadolinium, terbium, dysprosium, holmium, erbium, thulium, ytterbium, lutetium, vanadium, niobium, tantalum, chromium, molybdenum, tungsten, manganese, rhenium, iron, cobalt, nickel, ruthenium rhodium, copper, zinc, magnesium, calcium, strontium, barium, boron, aluminum, gallium, indium, thallium, silicon, tin, lead, phosphorus, arsenic, antimony, bismuth and tellurium and x is from 0.01 to 0.7, by reactive sputtering or reactive magnetron sputtering of the target under reduced pressure in a process gas atmosphere containing noble gas and reactive gases and
(2) deposition of the resulting composition onto the surface.

4. A process as defined in claim 3, wherein the volume ratio of noble gas to the reactive gases is from 1 : 5 to 100 : 1.

5. A process as defined in claim 3, wherein the noble gas used comprises one or more noble gases from the group consisting of neon, argon, krypton and xenon.

6. A process as defined in claim 3, wherein the nobel gas used is a mixture of argon and one or more noble gases from the group consisting of neon, krypton and xenon, the volume ratio of argon to the other noble gas or gases being from 1: 5 to 10 : 1.

7. A process as defined in claim 4, wherein the noble gas used comprises one or more noble gases from the group consisting of neon, argon, krypton and xenon.

* * * * *

UNITED STATES PATENT AND TRADEMARK OFFICE
CERTIFICATE OF CORRECTION

PATENT NO. : 5,108,846
DATED : April 28, 1992
INVENTOR(S) : Helmut STEININGER

It is certified that error appears in the above-identified patent and that said Letters Patent is hereby corrected as shown below:

Claim 6, Col. 16, Line 61

"nobel" should read --noble--

Signed and Sealed this

Third Day of August, 1993

Attest:

MICHAEL K. KIRK

Attesting Officer    Acting Commissioner of Patents and Trademarks